US012610470B2

(12) United States Patent (10) Patent No.: US 12,610,470 B2
Ting et al. (45) Date of Patent: Apr. 21, 2026

(54) ELECTRONIC DEVICE

(71) Applicant: Innolux Corporation, Miaoli County (TW)

(72) Inventors: Chin-Lung Ting, Miaoli County (TW); Kazuyuki Hashimoto, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 178 days.

(21) Appl. No.: 18/426,346

(22) Filed: Jan. 30, 2024

(65) Prior Publication Data

US 2024/0373558 A1     Nov. 7, 2024

Related U.S. Application Data

(60) Provisional application No. 63/464,192, filed on May 5, 2023.

(51) Int. Cl.
H05K 1/181 (2026.01)
H05K 1/02 (2006.01)

(52) U.S. Cl.
CPC ........... H05K 1/181 (2013.01); H05K 1/0213 (2013.01); H05K 2201/10015 (2013.01); H05K 2201/10174 (2013.01)

(58) Field of Classification Search
CPC ...................................... H05K 1/181

USPC ......................................................... 361/760
See application file for complete search history.

(56) References Cited

U.S. PATENT DOCUMENTS

| 2007/0111380 A1* | 5/2007 | Cho ........................ H05K 1/165 |
| | | 438/106 |
| 2009/0086451 A1* | 4/2009 | Kim ...................... H05K 1/0218 |
| | | 361/762 |
| 2016/0087583 A1* | 3/2016 | Matsumoto .............. H03B 5/36 |
| | | 331/116 R |
| 2021/0118835 A1* | 4/2021 | Wu ..................... H01L 23/5385 |

FOREIGN PATENT DOCUMENTS

CN          108604734          9/2018

\* cited by examiner

*Primary Examiner* — Stanley Tso
(74) *Attorney, Agent, or Firm* — JCIPRNET

(57) ABSTRACT

An electronic device is provided. The electronic device includes a tunable circuit. The tunable circuit includes a first substrate, a tunable component, a first signal terminal, a second signal terminal, a first control terminal, and a second control terminal. The tunable component includes a first terminal and a second terminal. The first signal terminal is coupled to the first terminal of the tunable component. The second signal terminal is coupled to the second terminal of the tunable component. The first control terminal is coupled to the first terminal of the tunable component. The second control terminal is coupled to the second terminal of the tunable component. At least a portion of the tunable circuit is formed on the first substrate.

18 Claims, 7 Drawing Sheets

ELECTRONIC DEVICE

CROSS-REFERENCE TO RELATED APPLICATION

This application claims the priority benefit of U.S. provisional application Ser. No. 63/464,192, filed on May 5, 2023. The entirety of the above-mentioned patent application is hereby incorporated by reference herein and made a part of this specification.

BACKGROUND

Technical Field

The disclosure relates a device; particularly, the disclosure relates to an electronic device.

Description of Related Art

For a conventional tunable circuit, it may operate according to a control signal and a tunable signal. However, when the tunable circuit operates at high frequency, there may be serious signal interference between the control signal and the tunable signal, thereby degrading the performance of the tunable circuit.

SUMMARY

The electronic device of the disclosure includes a tunable circuit. The tunable circuit includes a first substrate, a tunable component, a first signal terminal, a second signal terminal, a first control terminal, and a second control terminal. The tunable component includes a first terminal and a second terminal. The first signal terminal is coupled to the first terminal of the tunable component. The second signal terminal is coupled to the second terminal of the tunable component. The first control terminal is coupled to the first terminal of the tunable component. The second control terminal is coupled to the second terminal of the tunable component. At least a portion of the tunable circuit is formed on the first substrate.

Based on the above, according to the electronic device of the disclosure, the tunable circuit of electronic device may have good signal isolation.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
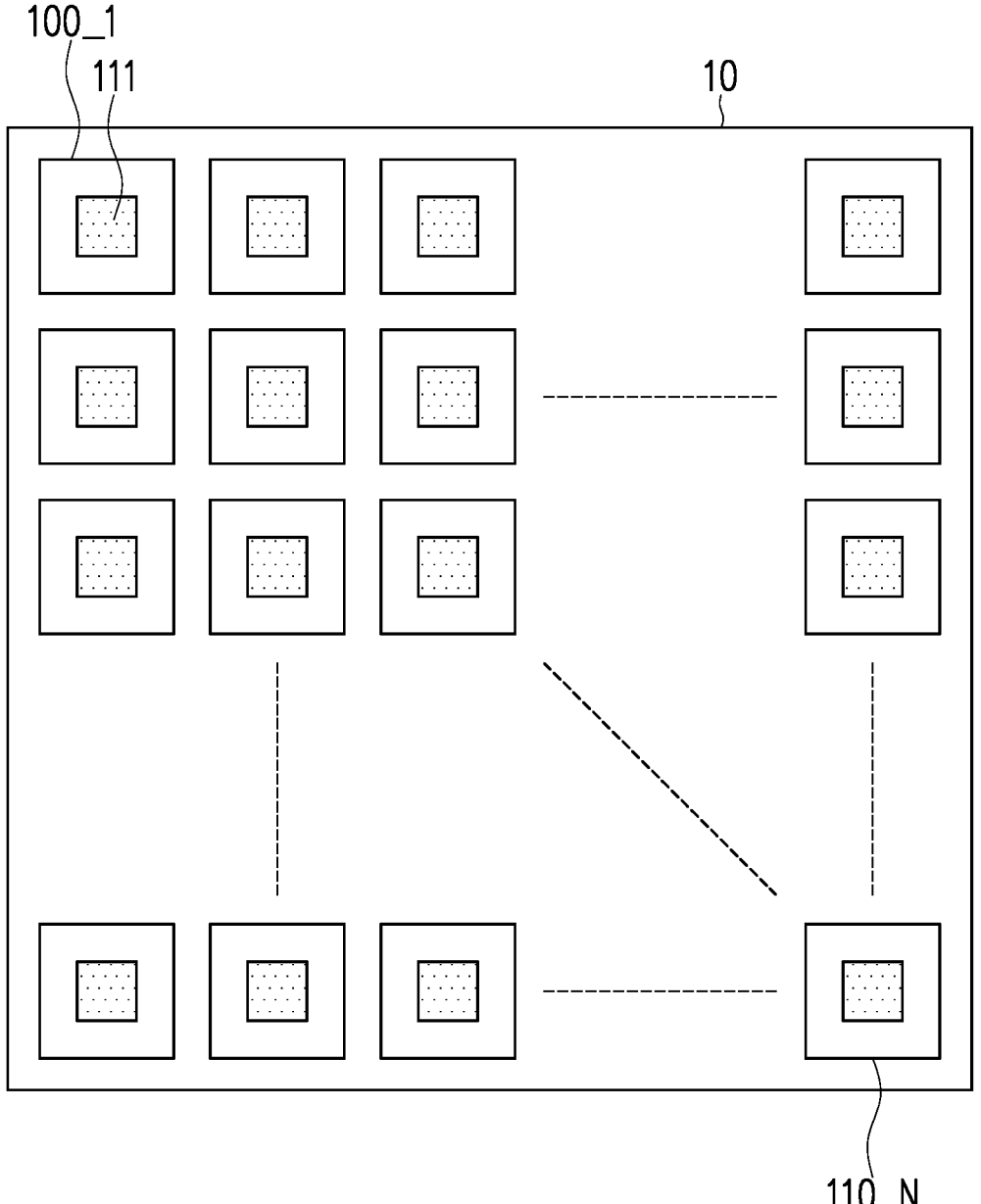
FIG. 1 is a schematic diagram of an electronic device according to an embodiment of the disclosure.

Reference will now be made in detail to the exemplary embodiments of the disclosure, examples of which are illustrated in the accompanying drawings. Whenever possible, the same reference numbers are used in the drawings and the description to refer to the same or like components.

Certain terms are used throughout the specification and appended claims of the disclosure to refer to specific components. Those skilled in the art should understand that electronic device manufacturers may refer to the same components by different names. This article does not intend to distinguish those components with the same function but different names. In the following description and rights request, the words such as "comprise" and "include" are open-ended terms, and should be explained as "including but not limited to . . . ".

The term "coupling (or connection)" used throughout the whole specification of the present application (including the appended claims) may refer to any direct or indirect connection means. For example, if the text describes that a first device is coupled (or connected) to a second device, it should be interpreted that the first device may be directly connected to the second device, or the first device may be indirectly connected through other devices or certain connection means to be connected to the second device. The terms "first", "second", and similar terms mentioned throughout the whole specification of the present application (including the appended claims) are merely used to name discrete elements or to differentiate among different embodiments or ranges. Therefore, the terms should not be regarded as limiting an upper limit or a lower limit of the quantity of the elements and should not be used to limit the arrangement sequence of elements. In addition, wherever possible, elements/components/steps using the same reference numerals in the drawings and the embodiments represent the same or similar parts. Reference may be mutually made to related descriptions of elements/components/steps using the same reference numerals or using the same terms in different embodiments.

FIG. 1 is a schematic diagram of an electronic device according to an embodiment of the disclosure. Referring to FIG. 1, the electronic device 10 includes a plurality of tunable units 100_1 to 100_N, and the tunable units 100_1 to 100_N may be arranged in an array as shown in FIG. 1, where N is a positive integer. Each of the tunable units 100_1 to 100_N includes a tunable component 111. In one embodiment of the disclosure, the each of the tunable units 100_1 to 100_N may be a resonator. A resonance frequency of each tunable unit may be tuned by a control signal of each corresponding tunable component.

In the embodiment of the disclosure, the tunable component 111 may be a voltage-controlled component (e.g. a variable capacitor, a varactor diode, or a Micro Electro Mechanical Systems (MEMS)), but the disclosure is not limited thereto. In one embodiment of the disclosure, the tunable component 111 may be a voltage-controlled component, a tunable capacitance component, a tunable inductance component or a tunable resistance component. In another embodiment of the disclosure, the electronic device 10 may be a beam-steerable directional antenna device, and the each of the tunable units 100_1 to 100_N may be an antenna unit.

Figure 2:
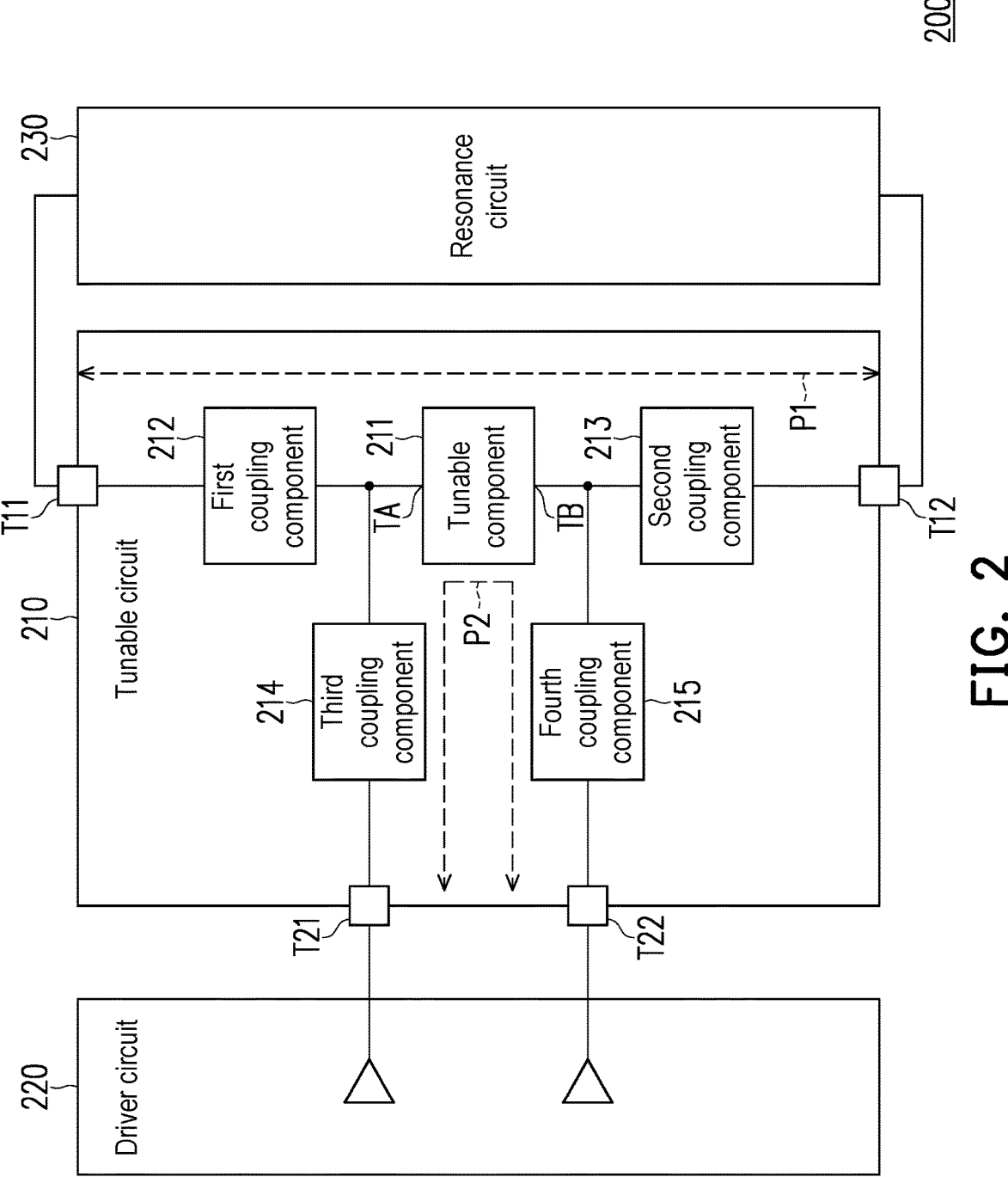
FIG. 2 is a schematic diagram of a tunable unit according to an embodiment of the disclosure.

FIG. 2 is a schematic diagram of a tunable unit according to an embodiment of the disclosure. Referring to FIG. 2, a tunable unit 200 includes a tunable circuit 210, a driver circuit 220, and a resonance circuit 230. The tunable circuit 210 is coupled to the driver circuit 220 and the resonance circuit 230 to form, for example, a resonator. In the embodiment of the disclosure, the tunable circuit 210 includes a tunable component 211, a first coupling component 212, a second coupling component 213, a third coupling component 214, a fourth coupling component 215, a first signal terminal T11, a second signal terminal T12, a first control terminal T21, and a second control terminal T22. The driver circuit 220 is coupled to a first control terminal and a second control terminal of the tunable circuit 210. The resonance circuit 230 is coupled to the first signal terminal T11 and the second signal terminal T12 of the tunable circuit 210. The each of the tunable units 100_1 to 100_N of FIG. 1 may be implemented as the tunable unit 200 of FIG. 2.

In the embodiment of the disclosure, the tunable component 211 includes a first terminal TA and a second terminal TB. The first signal terminal T11 is coupled to the first terminal TA of the tunable component 211 through the first coupling component 212. The first coupling component 212 is coupled between the first terminal TA of the tunable component 211 and the first signal terminal T11. The second signal terminal T12 is coupled to the second terminal TB of the tunable component 211 through the second coupling component 213. The second coupling component 213 is coupled between the second terminal TB of the tunable component 211 and the second signal terminal T12. In the embodiment of the disclosure, the first signal terminal T11 and the second signal terminal T12 are coupled to the tunable component 211 through capacitive coupling respectively. In one embodiment of the disclosure, the first signal terminal T11 and the second signal terminal T12 may be coupled to the tunable component 211 through inductive coupling respectively. The first coupling component 212 and the second coupling component 213 may include at least one capacitor respectively (e.g. the Metal-Insulator-Metal (MIM) capacitor). In the embodiment of the disclosure, the first signal terminal T11, the first coupling component 212, the tunable component 211, the second coupling component 213 and the second signal terminal T12 form a tunable signal path P1. In the embodiment of the disclosure, a coupling coefficient corresponding to the first coupling component 212 and the second coupling component 213 may be optimized to cover a frequency band of signal to be tuned (i.e. form a high-pass filter).

In the embodiment of the disclosure, the first control terminal T21 is coupled to the first terminal TA of the tunable component 211 through the third coupling component 214. The third coupling component 214 is coupled between the first terminal TA of the tunable component 211 and the first control terminal T21. The second control terminal T22 is coupled to the second terminal TB of the tunable component 211 through the fourth coupling component 215. The fourth coupling component 215 is coupled between the second terminal TB of the tunable component 211 and the second control terminal T22. In one embodiment of the disclosure, the first control terminal T21 and the second control terminal T22 are coupled to the tunable component 211 through resistive coupling and/or inductive coupling respectively. The third coupling component 214 and the fourth coupling component 215 may include at least one of a resistor and an inductor respectively. In the embodiment of the disclosure, the first control terminal T21, the third coupling component 214, the tunable component 211, the fourth coupling component 215 and the second control terminal T22 form a control signal path P2. In the embodiment of the disclosure, a coupling coefficient corresponding to the third coupling component 214 and the fourth coupling component 215 may be optimized to block the frequency band of signal to be tuned (i.e. form a low-pass filter or a RF choke).

In the embodiment of the disclosure, the tunable circuit 210, the driving circuit 220, and the resonance circuit 230 form the tunable unit 200, therefore a tunable signal flows through the first signal terminal T11, the first coupling component 212, the tunable component 211, the second coupling component 213, the second signal terminal T12, and the resonance circuit 230. The tunable signal may be an alternating current (AC) signal with a first signal frequency. In the embodiment of the disclosure, at least one of the first control terminal T21 and the second control terminal T22 receives a variable control signal to tune the tunable circuit 210. In one embodiment of the disclosure, the first control terminal T21 and the second control terminal T22 may receive a differential signal. The variable control signal may be a variable voltage or a variable current. In the embodiment of the disclosure, the variable control signal may be a direct current (DC) signal or the AC signal with a second signal frequency. In one embodiment of the disclosure, if the variable control signal is the AC signal, the first signal frequency of the tunable signal is higher than the second signal frequency of the variable control signal.

In the embodiment of the disclosure, due to the first signal terminal T11 and the second signal terminal T12 are coupled to the tunable component 211 through the capacitive coupling, the DC signal or the AC signal with low signal frequency may be blocked by the first coupling component 212 and the second coupling component 213 thus may not reach to the first signal terminal T11 and the second signal terminal T12. Moreover, the variable control signal from at least one of the first control terminal T21 and the second control terminal T22 may reach to the tunable component 211 through the resistive coupling and/or the inductive coupling (i.e. the control signal path P2), but the tunable signal from the tunable signal path P1 between the first signal terminal T11 and the second signal terminal T12 may be blocked due to the resistive coupling and/or the inductive coupling formed with the third coupling component 214 and the fourth coupling component 215.

In the embodiment of the disclosure, the tunable signal path P1 between the first signal terminal T11 and the second signal terminal T12 may be tuned by the first control terminal T21 and the second control terminal T22. The capacitive coupling between the first signal terminal T11 and the second signal terminal T12 may be tuned by the first control terminal T21 and the second control terminal T22. Specifically, the first signal frequency of the tunable signal may be tuned by the tunable component 211, and the tunable component 211 may be tuned according to the voltage level or the second signal frequency of the variable control signal. Moreover, there may be good signal isolation in the frequency domain between the tunable signal path P1 and the control signal path P2.

In addition, in the embodiment of the disclosure, the tunable unit 200 may further include a first substrate and a second substrate, and at least a portion of the tunable circuit 210 may be formed on the first substrate. The first substrate may be a Si, GaAs, SiC, or GaNx substrate, and the second substrate may be a glass substrate, a polyimide (PI) substrate or a printed circuit board (PCB) substrate. The first substrate may be bonded on the second substrate. In the embodiment of the disclosure, at least a portion of the tunable circuit 210 is formed on the first substrate. The driving circuit 220 may be formed on the second substrate with at least one transistor (e.g. the thin-film transistor (TFT)) and at least one capacitor, but the disclosure is not limited thereto. In one embodiment of the disclosure, the driving circuit 220 may be integrated in an integrated circuit (IC), and the driving circuit 220 may be coupled to the first control terminal T21 and the second control terminal T22 through pins of the integrated circuit. In the embodiment of the disclosure, the resonance circuit 230 may be formed on the second substrate with at least one of a transistor, a capacitor, an inductor, and a resistor, but the disclosure is not limited thereto. In one embodiment of the disclosure, the resonance circuit 230 may be formed on the first substrate or on another Si, GaAs, SiC, or GaNx substrate.

The specific substrate configuration relationship of the tunable circuit of the disclosure will be described in detail in the following embodiments of FIG. 3 to FIG. 7.

Figure 3:
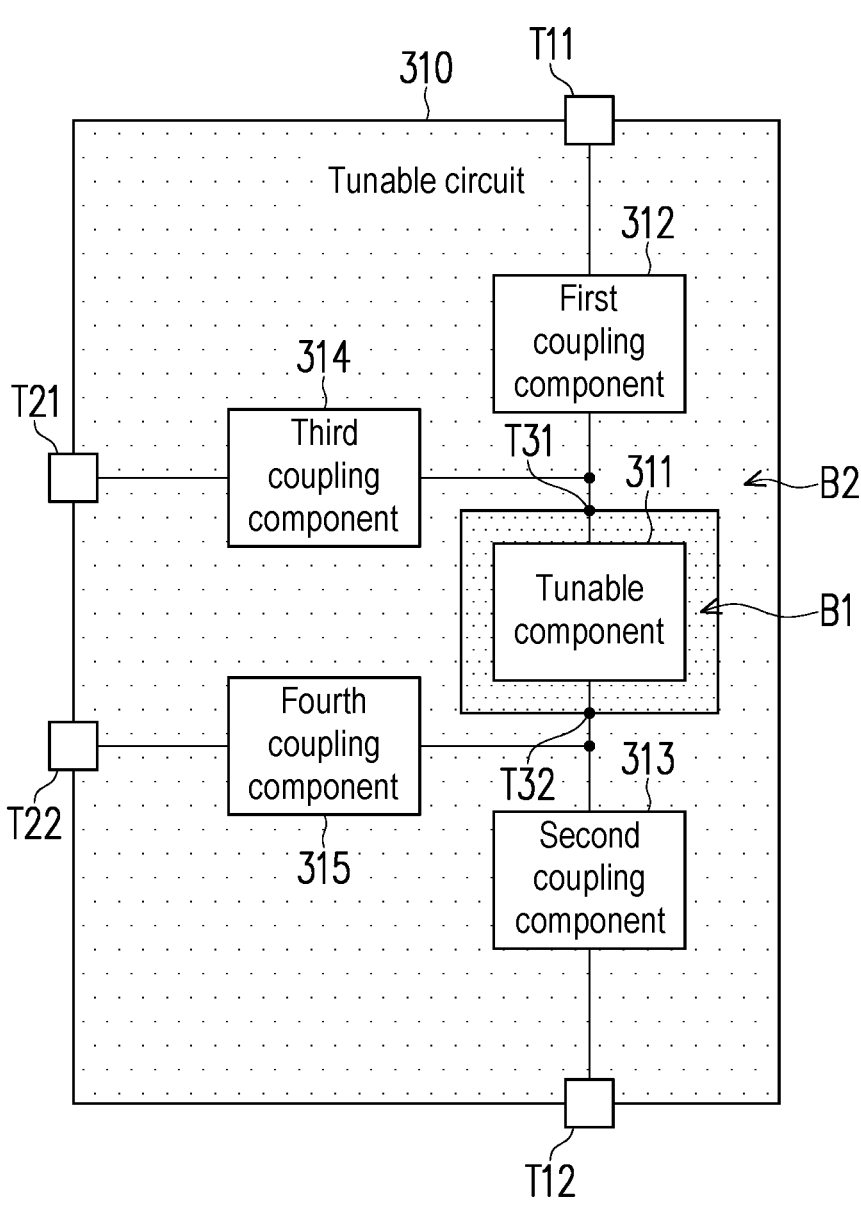
FIG. 3 is a schematic diagram of a tunable circuit according to an embodiment of the disclosure.

FIG. 3 is a schematic diagram of a tunable circuit according to an embodiment of the disclosure. Referring to FIG. 3, the tunable circuit 310 includes a first substrate B1, a second substrate B2, a tunable component 311, a first coupling component 312, a second coupling component 313, a third coupling component 314, a fourth coupling component 315, a first signal terminal T11, a second signal terminal T12, a first control terminal T21, and a second control terminal T22. In the embodiment of the disclosure, the tunable component 311 is formed on the first substrate B1. The first coupling component 312, the second coupling component 313, the third coupling component 314, and the fourth coupling component 315 are formed on the second substrate B2. The first substrate B1 may be a Si, GaAs, SiC, or GaNx substrate, and the second substrate B2 may be a glass substrate, a PI substrate or a PCB substrate. In the embodiment of the disclosure, the first substrate B1 is bonded on the second substrate B2 with two bonding pads T31 and T32 as shown in FIG. 3.

In the embodiment of the disclosure, the tunable component 311 may be realized with a variable capacitor, a varactor diode, or a MEMS on the first substrate B1.

In the embodiment of the disclosure, the first coupling component 312 and the second coupling component 313 which realize capacitive coupling are formed on the second substrate B2. The first coupling component 312 may include a first capacitor, and the second coupling component 313 may include a second capacitor. The first capacitor and the second capacitor may be MIM capacitors. At least one of the first capacitor and the second capacitor may be formed with conductive layers (e.g. Mo, Al or Cu) and a dielectric layer (e.g. SiNx or SiO2) on the second substrate B2.

In the embodiment of the disclosure, the third coupling component 314 and the fourth coupling component 315 which realize resistive coupling or inductive coupling are formed on the second substrate B2. The third coupling component 314 may include at least one of a first resistor and a first inductor, and the fourth coupling component 315 may include at least one of a second resistor and a second inductor. At least one of the first resistance, the first inductance, the second resistance, and the second inductance is formed with the conductive layer on the second substrate B2.

Figure 4:
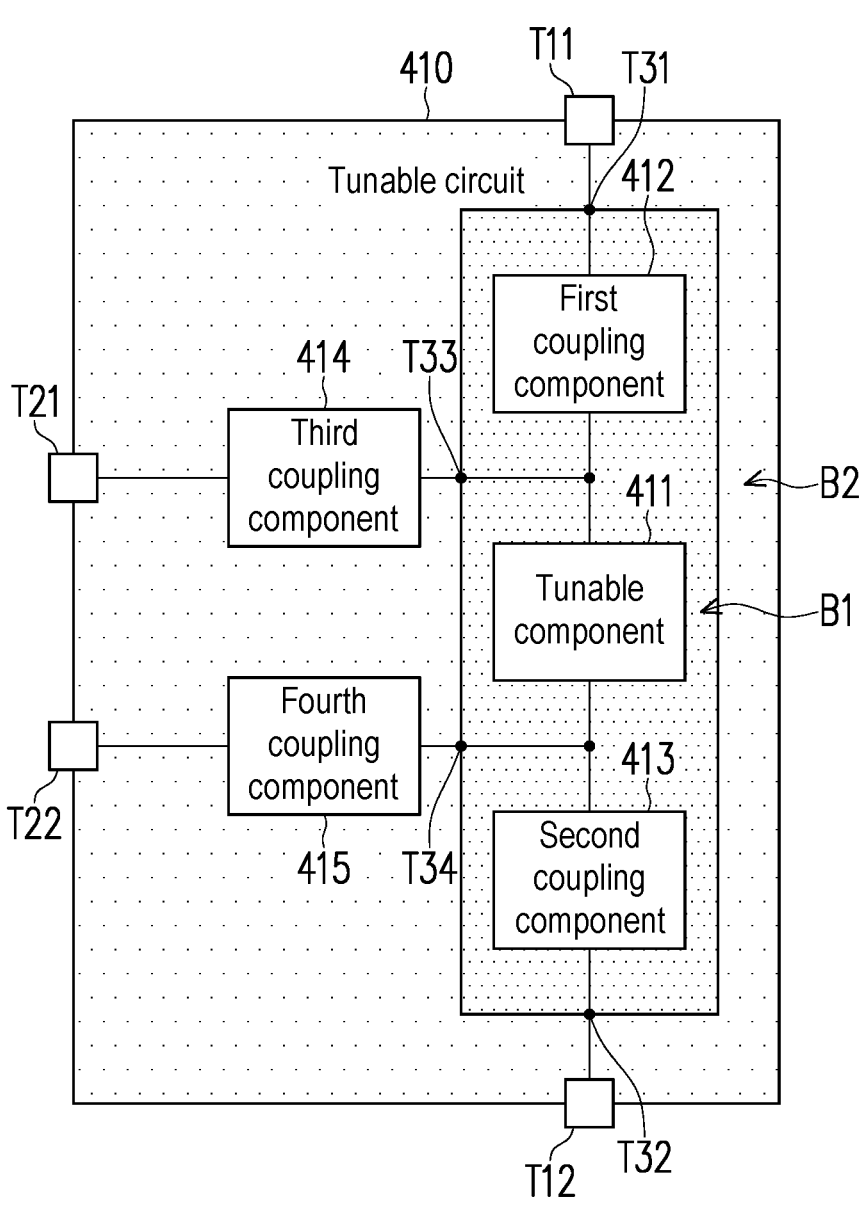
FIG. 4 is a schematic diagram of a tunable circuit according to an embodiment of the disclosure.

FIG. 4 is a schematic diagram of a tunable circuit according to an embodiment of the disclosure. Referring to FIG. 4, the tunable circuit 410 includes a first substrate B1, a second substrate B2, a tunable component 411, a first coupling component 412, a second coupling component 413, a third coupling component 414, a fourth coupling component 415, a first signal terminal T11, a second signal terminal T12, a first control terminal T21, and a second control terminal T22. In the embodiment of the disclosure, the tunable component 411, the first coupling component 412, and the second coupling component 413 are formed on the first substrate B1. The third coupling component 414 and the fourth coupling component 415 are formed on the second substrate B2. The first substrate B1 may be a Si, GaAs, SiC, or GaNx substrate, and the second substrate B2 may be a glass substrate, a PI substrate or a PCB substrate. In the embodiment of the disclosure, the first substrate B1 is bonded on the second substrate B2 with four bonding pads T31 to T34 as shown in FIG. 4.

In the embodiment of the disclosure, the tunable component 411 may be realized with a variable capacitor, a varactor diode, or a MEMS on the first substrate B1.

In the embodiment of the disclosure, the first coupling component 412 and the second coupling component 413 which realize capacitive coupling are formed on the first substrate B1. The first coupling component 412 may include a first capacitor, and the second coupling component 413 may include a second capacitor. The first capacitor and the second capacitor may be MIM capacitors. At least one of the first capacitor and the second capacitor may be formed with conductive layers and a dielectric layer on the first substrate B1.

In the embodiment of the disclosure, the third coupling component 414 and the fourth coupling component 415 which realize resistive coupling or inductive coupling are formed on the second substrate B2. The third coupling component 414 may include at least one of a first resistor and a first inductor, and the fourth coupling component 415 may include at least one of a second resistor and a second inductor. At least one of the first resistance, the first inductance, the second resistance, and the second inductance is formed with a conductive layer on the second substrate B2.

Figure 5:
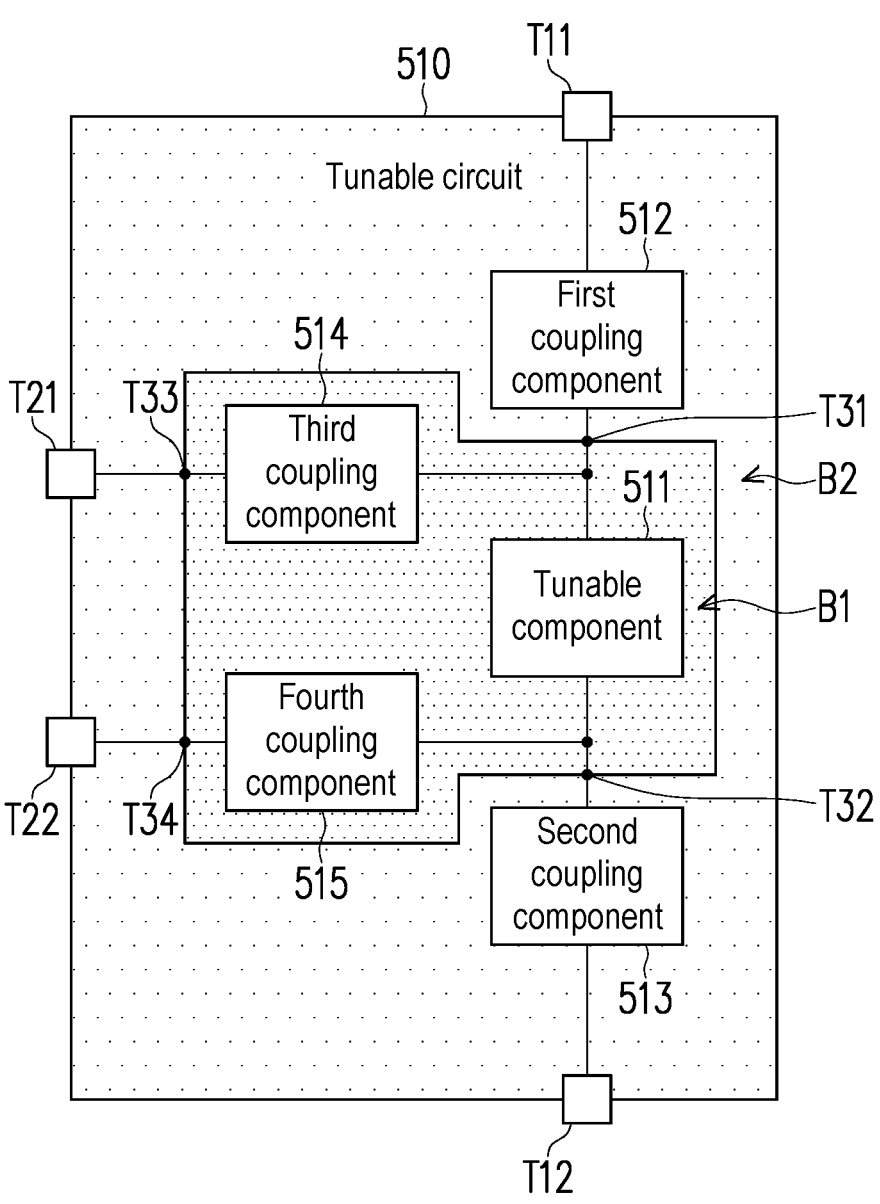
FIG. 5 is a schematic diagram of a tunable circuit according to an embodiment of the disclosure.

FIG. 5 is a schematic diagram of a tunable circuit according to an embodiment of the disclosure. Referring to FIG. 5, the tunable circuit 510 includes a first substrate B1, a second substrate B2, a tunable component 511, a first coupling component 512, a second coupling component 513, a third coupling component 514, a fourth coupling component 515, a first signal terminal T11, a second signal terminal T12, a first control terminal T21, and a second control terminal T22. In the embodiment of the disclosure, the tunable component 511, the third coupling component 514 and the fourth coupling component 515 are formed on the first substrate B1. The first coupling component 512, and the second coupling component 513 are formed on the second substrate B2. The first substrate B1 may be a Si, GaAs, SiC, or GaNx substrate, and the second substrate B2 may be a glass substrate, a PI substrate or a PCB substrate. In the embodiment of the disclosure, the first substrate B1 is bonded on the second substrate B2 with four bonding pads T31 to T34 as shown in FIG. 5.

In the embodiment of the disclosure, the tunable component 511 may be realized with a variable capacitor, a varactor diode, or a MEMS on the first substrate B1.

In the embodiment of the disclosure, the first coupling component 512 and the second coupling component 513 which realize capacitive coupling are formed on the second substrate B2. The first coupling component 512 may include a first capacitor, and the second coupling component 513 may include a second capacitor. The first capacitor and the second capacitor may be MIM capacitors. At least one of the first capacitor and the second capacitor may be formed with conductive layers and a dielectric layer on the second substrate B2.

In the embodiment of the disclosure, the third coupling component 514 and the fourth coupling component 515 which realize resistive coupling or inductive coupling are formed on the first substrate B1. The third coupling component 514 may include at least one of a first resistor and a first inductor, and the fourth coupling component 515 may include at least one of a second resistor and a second inductor. At least one of the first resistance, the first inductance, the second resistance, and the second inductance is formed with a conductive layer on the first substrate B1.

Figure 6:
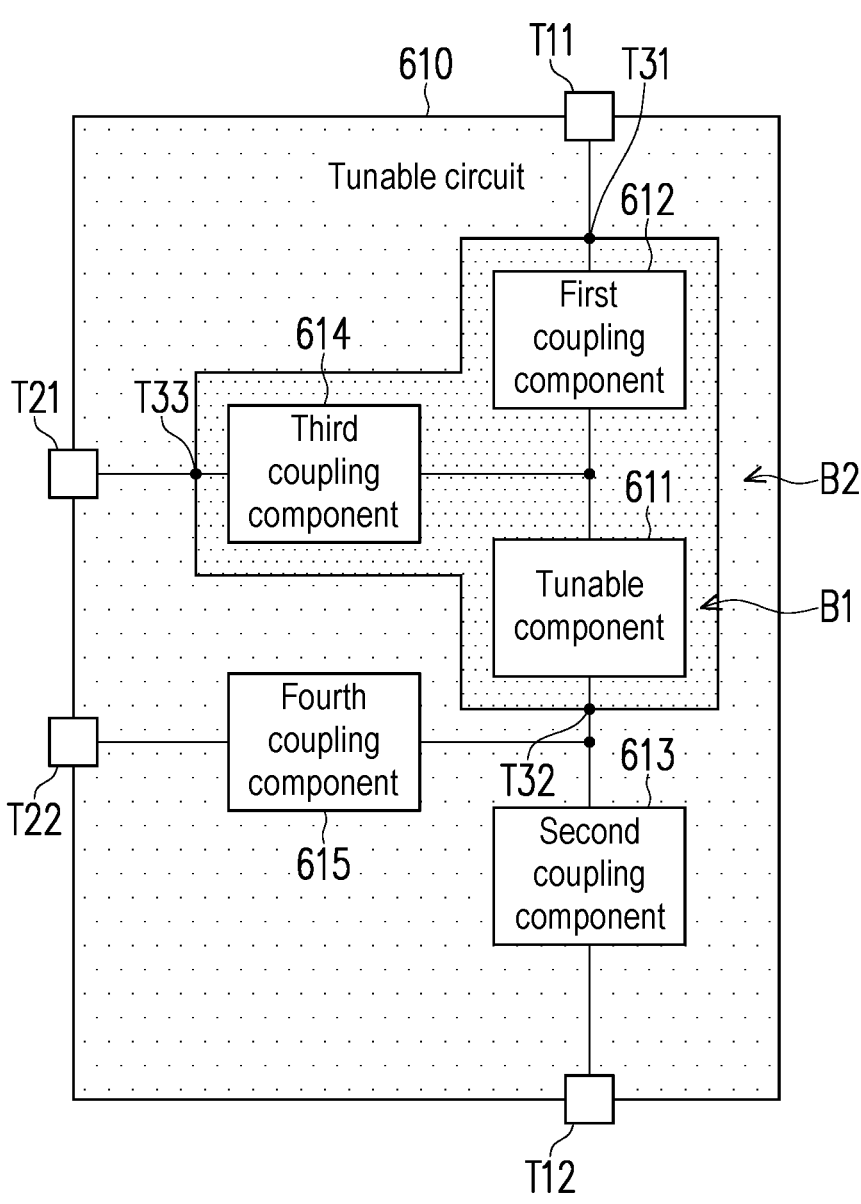
FIG. 6 is a schematic diagram of a tunable circuit according to an embodiment of the disclosure.

FIG. 6 is a schematic diagram of a tunable circuit according to an embodiment of the disclosure. Referring to FIG. 6, the tunable circuit 610 includes a first substrate B1, a second substrate B2, a tunable component 611, a first coupling component 612, a second coupling component 613, a third coupling component 614, a fourth coupling component 615, a first signal terminal T11, a second signal terminal T12, a first control terminal T21, and a second control terminal T22. In the embodiment of the disclosure, the tunable component 611, the first coupling component 612, and the third coupling component 614 are formed on the first substrate B1. The second coupling component 613 and the fourth coupling component 615 are formed on the second substrate B2. The first substrate B1 may be a Si, GaAs, SiC, or GaNx substrate, and the second substrate B2 may be a glass substrate, a PI substrate or a PCB substrate. In the embodiment of the disclosure, the first substrate B1 is bonded on the second substrate B2 with three bonding pads T31 to T33 as shown in FIG. 6.

In the embodiment of the disclosure, the tunable component 611 may be realized with a variable capacitor, a varactor diode, or a MEMS on the first substrate B1.

In the embodiment of the disclosure, the first coupling component 612 which realizes capacitive coupling is formed on the first substrate B1. The first coupling component 612 may include a first capacitor, and the first capacitor may be a MIM capacitor. The first capacitor may be formed with conductive layers and a dielectric layer on the first substrate B1.

In the embodiment of the disclosure, the second coupling component 613 which realizes capacitive coupling is formed on the second substrate B2. The second coupling component 513 may include a second capacitor. The second capacitor may be a MIM capacitor. The second capacitor may be formed with conductive layers and a dielectric layer on the second substrate B2.

In the embodiment of the disclosure, the third coupling component 614 which realizes resistive coupling or inductive coupling is formed on the first substrate B1. The third coupling component 614 may include at least one of a first resistor and a first inductor. At least one of the first resistance and the first inductance is formed with the conductive layer on the first substrate B1.

In the embodiment of the disclosure, the fourth coupling component 615 which realizes resistive coupling or inductive coupling is formed on the second substrate B2. The fourth coupling component 615 may include at least one of a second resistor and a second inductor. At least one of the second resistance and the second inductance is formed with the conductive layer on the second substrate B2.

Figure 7:
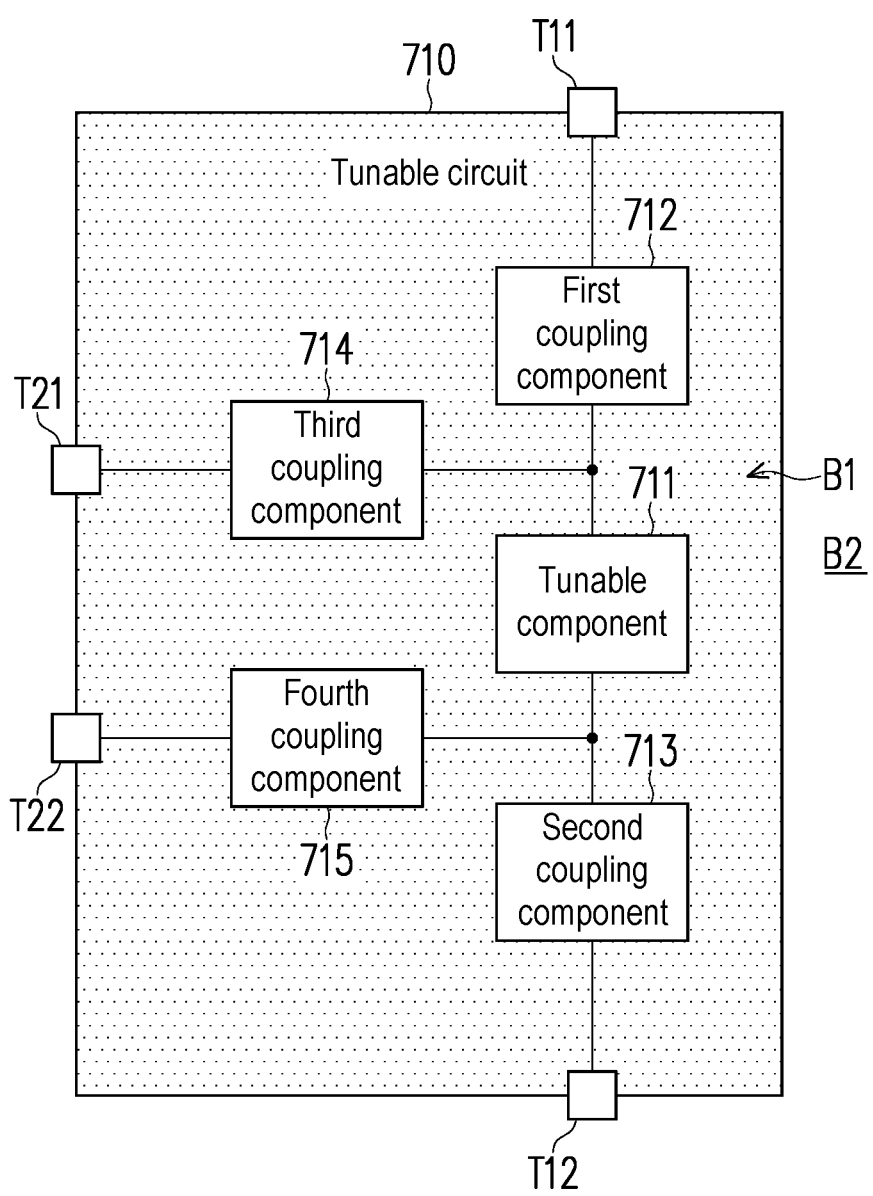
FIG. 7 is a schematic diagram of a tunable circuit according to an embodiment of the disclosure.

FIG. 7 is a schematic diagram of a tunable circuit according to an embodiment of the disclosure. Referring to FIG. 7, the tunable circuit 710 includes a first substrate B1, a tunable component 711, a first coupling component 712, a second coupling component 713, a third coupling component 714, a fourth coupling component 715, a first signal terminal T11, a second signal terminal T12, a first control terminal T21, and a second control terminal T22. In the embodiment of the disclosure, the tunable component 711, the first coupling component 712, the second coupling component 713, the third coupling component 714 and the fourth coupling component 715 are formed on the first substrate B1. A resonance circuit (i.e. the resonance circuit 230 of FIG. 2) coupled to the first signal terminal T11 and the second signal terminal T12 may be formed on the second substrate B2. A driver circuit (i.e. the driver circuit 220 of FIG. 2) coupled to the first control terminal T21 and the second control terminal T22 may also be formed on the second substrate B2.

In the embodiment of the disclosure, the first substrate B1 may be different from the second substrate B2. The first substrate B1 may be a Si, GaAs, SiC, or GaNx substrate, and the second substrate B2 may be a glass substrate, a PI substrate or a PCB substrate. In the embodiment of the disclosure, the first substrate B1 is bonded on the second substrate B2 with four bonding pads. The four bonding pad serve as the first signal terminal T11, the second signal terminal T12, the first control terminal T21, and the second control terminal T22. However, in one embodiment of the disclosure, the first substrate B1 and the second substrate B2 may be the same substrate, such as the glass substrate, the PI substrate or the PCB substrate.

In the embodiment of the disclosure, the tunable component 711 may be realized with a variable capacitor, a varactor diode, or a MEMS on the first substrate B1.

In the embodiment of the disclosure, the first coupling component 712 and the second coupling component 713 which realize capacitive coupling are formed on the first substrate B1. The first coupling component 712 may include a first capacitor, and the second coupling component 713 may include a second capacitor. The first capacitor and the second capacitor may be MIM capacitors. At least one of the first capacitor and the second capacitor may be formed with conductive layers and a dielectric layer on the first substrate B1.

In the embodiment of the disclosure, the third coupling component 714 and the fourth coupling component 715 which realize resistive coupling or inductive coupling are formed on the first substrate B1. The third coupling component 714 may include at least one of a first resistor and a first inductor, and the fourth coupling component 715 may include at least one of a second resistor and a second inductor. At least one of the first resistance, the first inductance, the second resistance, and the second inductance is formed with the conductive layer on the first substrate B1.

In summary, the electronic device of the disclosure may implement the tunable circuit having good signal isolation between the tunable signal path and the control signal path. In addition, in some embodiment of the disclosure, the at least a portion of the tunable circuit of the electronic device may be formed on the glass substrate for cost reduction.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic device, comprising:

a tunable circuit, comprising:

a first substrate;

a tunable component, comprising a first terminal and a second terminal;

a first signal terminal, coupled to the first terminal of the tunable component;

a second signal terminal, coupled to the second terminal of the tunable component;

a first control terminal, coupled to the first terminal of the tunable component; and a second control terminal, coupled to the second terminal of the tunable component, wherein at least a portion of the tunable circuit is formed on the first substrate, wherein at least one of the first control terminal and the second control terminal receives a variable control signal to tune the tunable circuit, wherein the variable control signal is a variable voltage or a variable current, wherein a tunable signal flows through the first signal terminal, the tunable component, and the second signal terminal, wherein a first signal frequency of the tunable signal is higher than a second signal frequency of the variable control signal.

2. The electronic device according to claim 1, wherein a tunable signal path between the first signal terminal and the second signal terminal is tuned by the first control terminal and the second control terminal.

3. The electronic device according to claim 2, wherein capacitive coupling between the first signal terminal and the second signal terminal is tuned by the first control terminal and the second control terminal.

4. The electronic device according to claim 1, wherein the tunable component is a variable capacitor, a varactor diode, or a micro electro mechanical systems.

5. The electronic device according to claim 4, wherein the tunable circuit further comprises:

a second substrate, wherein the first substrate is different from the second substrate, and the first substrate is bonded on the second substrate, wherein the tunable component is formed on the first substrate.

6. The electronic device according to claim 5, wherein the second substrate is a glass substrate.

7. The electronic device according to claim 5, wherein the second substrate is a polyimide substrate.

8. The electronic device according to claim 5, wherein the second substrate is a printed circuit board substrate.

9. The electronic device according to claim 1, wherein the tunable circuit further comprises:

a first coupling component, coupled between the first terminal of the tunable component and the first signal terminal; and a second coupling component, coupled between the second terminal of the tunable component and the second signal terminal.

10. The electronic device according to claim 9, wherein the first coupling component comprises a first capacitor, and the second coupling component comprises a second capacitor.

11. The electronic device according to claim 10, wherein the tunable circuit further comprises:

a second substrate, wherein the first substrate is different from the second substrate, and the first substrate is bonded on the second substrate, wherein at least one of the first capacitor and the second capacitor is formed with conductive layers and a dielectric layer on the second substrate.

12. The electronic device according to claim 1, wherein the tunable circuit further comprises:

a third coupling component, coupled between the first terminal of the tunable component and the first control terminal; and a fourth coupling component, coupled between the second terminal of the tunable component and the second control terminal.

13. The electronic device according to claim 12, wherein the third coupling component comprises at least one of a first resistor and a first inductor, and the fourth coupling component comprises at least one of a second resistor and a second inductor.

14. The electronic device according to claim 13, wherein the tunable circuit further comprises:

a second substrate, wherein the first substrate is different from the second substrate, and the first substrate is bonded on the second substrate, wherein at least one of the first resistor, the first inductor, the second resistor, and the second inductor is formed with a conductive layer on a second substrate.

15. The electronic device according to claim 1, further comprising:

a driving circuit, coupled to the first control terminal and the second control terminal, wherein the first control terminal, the tunable component, and the second control terminal form a control signal path.

16. The electronic device according to claim 15, wherein the driving circuit is formed on a second substrate with at least one transistor and at least one capacitor, wherein the second substrate is different from the first substrate, and the first substrate is bonded on the second substrate.

17. The electronic device according to claim 15, wherein the driving circuit is integrated in an integrated circuit.

18. The electronic device according to claim 1, further comprising:

a resonance circuit, coupled to the first signal terminal and the second signal terminal.

* * * * *